United States Patent
Donnelly et al.

(10) Patent No.: US 10,280,945 B2
(45) Date of Patent: May 7, 2019

(54) DEVICE FOR MOVING AIR

(71) Applicants: Brian Donnelly, Dublin (IE); Nicholas Jeffers, Wicklow (IE); Jason Stafford, Wexford (IE)

(72) Inventors: Brian Donnelly, Dublin (IE); Nicholas Jeffers, Wicklow (IE); Jason Stafford, Wexford (IE)

(73) Assignee: Alcatel Lucent, Paris (FR)

( * ) Notice: Subject to any disclaimer, the term of this patent is extended or adjusted under 35 U.S.C. 154(b) by 1453 days.

(21) Appl. No.: 13/757,075

(22) Filed: Feb. 1, 2013

(65) Prior Publication Data

US 2014/0219840 A1  Aug. 7, 2014

(51) Int. Cl.
- *F04D 33/00* (2006.01)
- *F04B 17/00* (2006.01)
- *F04B 43/04* (2006.01)
- *H05K 7/20* (2006.01)

(52) U.S. Cl.
CPC ............ *F04D 33/00* (2013.01); *F04B 17/003* (2013.01); *F04B 43/046* (2013.01); *H05K 7/20172* (2013.01)

(58) Field of Classification Search
CPC .... F04D 33/00; H05K 7/20172; F04B 17/003
USPC ...................... 417/322, 410.2, 436
See application file for complete search history.

(56) References Cited

U.S. PATENT DOCUMENTS

| | | | |
|---|---|---|---|
| 4,498,851 A * | 2/1985 | Kolm et al. | 417/410.2 |
| 4,923,000 A | 5/1990 | Nelson | |
| 5,381,950 A * | 1/1995 | Aldridge | 236/1 R |
| 7,518,289 B2 * | 4/2009 | Kobayashi | H01L 41/053 310/331 |
| 2003/0182711 A1 * | 10/2003 | Klotz et al. | 2/171.3 |
| 2008/0062644 A1 * | 3/2008 | Petroski | 361/695 |
| 2010/0038994 A1 * | 2/2010 | Eichhorner et al. | 310/317 |

FOREIGN PATENT DOCUMENTS

| | | | | |
|---|---|---|---|---|
| JP | 56500576 A | | 4/1981 | |
| JP | 340462 A | | 2/1991 | |
| JP | 2000261173 | * | 9/2000 | .......... F25D 1/00 |
| JP | 2000261173 A | | 9/2000 | |
| JP | 2002134975 A | | 5/2002 | |

(Continued)

OTHER PUBLICATIONS

"Piezoelectric Fans Could Be the New Way to Cool," FrostyTech News, http://www.frostytech.com/permalinkArch.cfm?NewsID=54891, Jan. 23, 2006, 3 pages.

(Continued)

*Primary Examiner* — Essama Omgba
*Assistant Examiner* — Timothy P Solak

(57) ABSTRACT

A device for moving air comprising a piezoelectric element attached to a planar body. The planar body is configured to oscillate at a movable end generating an airflow in response to applying alternating electric current to said piezoelectric element. The device further comprises a partial cavity defined by a base plate, a first wall and a second wall which surrounds the movable end of the planar body. The base plate further comprises an opening located proximate to said movable end of the planar body. In operation the air flow generated by the planar body is forced out of the device through the opening.

8 Claims, 3 Drawing Sheets

(56) References Cited

FOREIGN PATENT DOCUMENTS

| JP | 2005024229 A | | 1/2005 | |
|---|---|---|---|---|
| JP | 2008297915 | * | 12/2008 | ............ F04D 33/00 |
| JP | 2008297915 A | | 12/2008 | |
| WO | 8002445 A1 | | 11/1980 | |
| WO | 2006092572 A1 | | 9/2006 | |

OTHER PUBLICATIONS

Petroski, J., et al., "Optimization of Piezoelectric Oscillating Fan-Cooled Heat Sinks for Electronics Cooling," IEEE Transactions on Components and Packaging Technology, vol. 33 No. 1, Mar. 2010, p. 25-31.

* cited by examiner

DEVICE FOR MOVING AIR

TECHNICAL FIELD

The present invention is directed, in general, to cooling techniques.

BACKGROUND

This section introduces aspects that may be helpful in facilitating a better understanding of the disclosure. Accordingly, the statements of this section are to be read in this light and are not to be understood as admissions about what is in the prior art or what is not in the prior art.

Piezoelectric devices are known. Typically a piezoelectric device comprises a body of a solid material having the property of accumulating electrical charge when a mechanical stress such as a pressure is applied thereupon. Conversely, such piezoelectric body exhibits a mechanical movement in response to an electric current applied thereto. Some examples of materials exhibiting piezoelectric property are certain crystals or ceramics. One implementation of a piezoelectric device is a piezofan. A piezofan is typically made of a piezoelectric element which is physically attached, e.g. bonded, to an end of a planar, typically thin, body (sometimes referred to as blade or cantilever) the other end of the body being free and movable. When an alternating electric current is applied to the piezoelectric element, the latter exhibits an oscillating movement, causing the opposite end of the planar body to move. If the frequency of the alternating current is equal to the resonant frequency of the planar body, the latter produces an amplified oscillating movement at the free end thereof. The oscillation of the free end of the planar body produces an airflow in a similar manner as a conventional hand fan.

SUMMARY

Some embodiments of the disclosure feature a device for moving air comprising a piezoelectric element attached to a planar body disposed at least in part between a first wall and a second wall, the planar body being configured to oscillate at a movable end between said walls generating an airflow in response to applying alternating electric current to said piezoelectric element; the device further comprising a base plate such that the first wall, the second wall and the base plate form a partially closed cavity surrounding the movable end of the planar body, said base plate further comprising an opening located proximate to said movable end of the planar body and configured for allowing an airflow from said partially closed cavity out of the device.

According to some specific embodiments, said first wall and said second wall are separated from each other by a variable distance of separation such that a distance of separation between the first wall and the second wall at a location proximate to the movable end is larger than a distance of separation between the first wall and the second wall at an intermediate location between the movable end and the piezoelectric element.

According to some specific embodiments, the cavity has a first open area for inlet of air from out of the device in the cavity in a first direction and a second open area for inlet of air from out of the device in the cavity in a second direction different from the first direction.

According to some specific embodiments, the opening in the base plate has an area which is smaller than the first open area and the second open area of the cavity.

Some embodiments of the disclosure feature a cooling system comprising a heat sink and a device for moving air, said device comprising a piezoelectric element attached to a planar body disposed at least in part between a first wall and a second wall, the planar body being configured to oscillate at a movable end between said walls generating an airflow in response to applying alternating electric current to said piezoelectric element; the device further comprising a base plate such that the first wall, the second wall and the base plate form a partially closed cavity surrounding the movable end of the planar body, said base plate further comprising an opening located proximate to said movable end of the planar body and configured for allowing a conduction of said airflow from said partially closed cavity out of the device.

BRIEF DESCRIPTION

For a more complete understanding of the present disclosure, reference is now made to the following descriptions taken in conjunction with the accompanying drawings, in which.

DETAILED DESCRIPTION

Figure 1:
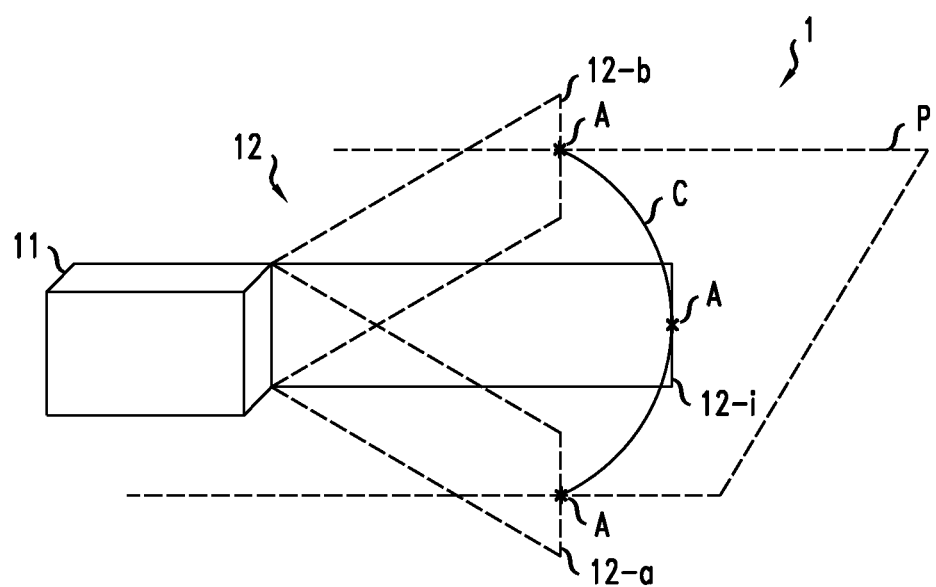
FIG. 1 is an exemplary illustration in partial perspective of a piezofan in a number of oscillating positions of the blade thereof.

A trend in producing electronic devices is toward reducing their size while enabling such devices of processing increasingly larger volumes of data. Processing larger volumes of data typically involves higher levels of heat generation which in turn would require stronger and more efficient cooling mechanisms.

One typical option for dissipating heat loads within electronic components is the use of passive heat sinks that combine natural convection and radiation heat transfer. As component heat loads increase, the size and therefore weight of these heat sinks would typically need to increase to keep component temperatures below their threshold values (i.e. highest value of the temperature at which a particular device operates normally). However, increasing the size of the heat sinks would cause an increase in the overall size and weight of the device which is typically undesirable for modern devices. Therefore, passive cooling systems involve physical limits as to their suitability for use in modern electronic devices.

Active cooling systems, e.g. the use of rotating fans, constitute another known solution which, compared to passive cooling systems, is typically capable of removing larger quantities of heat from an electronic component. However, such active cooling systems typically suffer from relatively short lifetimes (typically about 5-7 yrs) and therefore poor reliability.

As mentioned above, future electronic products may require higher performance and functionality coupled with lower product volume.

Embodiments of the disclosure feature a device for moving air, also referred to herein as a piezofan, for providing active cooling. Some solutions directed to the use of a piezofan together with a passive heat sink are known. Such known devices typically draw air into the device either from the rear side of the device opposite to the side where the free end of the blade is located, or they draw air from the region above the free end of the blade. Some known devices use a combination of these two configurations. In either one of these configurations air exits the device from the front side thereof proximate to the free end of the blade and in a parallel direction with respect to a plane of oscillation of the blade (defined further below). Such known devices are herein referred to as through-flow devices.

However in occasions it may be necessary to direct the flow of the air out of the device from a region which is different from the front end of the device. One example of such occasions is when a plurality of heat loads are mounted in vertical arrangement (i.e. one heat load mounted vertically above another). In such situations, often the heat generated by a lower heat load may move upward to an upper heat load thereby increasing the temperature of the region surrounding the upper heat load. If a conventional through-flow piezofan is used to generate an air flow to remove the heat from the lower heat load, the action of the through-flow piezofan will cause an even stronger transfer of the heat from the lower heat load to the upper heat load causing additional heating on the latter, or at least impairing the efficient cooling of the upper heat load. This situation is clearly undesirable.

Embodiments of the disclosure feature a device for moving air configured to generate a flow of air out of the device in a direction which is at an angle from a plane of oscillation of the blade. Such direction of flow of the air is herein referred to as diverted-flow direction and a device configured to operate with diverted-flow direction is referred to herein as a diverted-flow device.

FIG. 1 is an exemplary illustration in partial perspective of a piezofan with the blade of the device shown in three oscillating positions. It is to be noted that FIG. 1 is a simplified illustration in which only the relevant parts of the piezofan have been shown for the sake of simplicity of discussion and real-life piezofans may have other elements and parts not shown in the figure.

The piezofan 1 of FIG. 1 comprises a piezoelectric element 11 which is physically attached to an end of a blade 12. The other end of the blade (opposite to the end attached to the piezoelectric element) is free and movable. As already mentioned above, by applying an alternating electric current to the piezoelectric element 11, the blade 12 undergoes an oscillating movement due to which the opposite end of the planar body exhibits a back and forth (oscillation) movement. In FIG. 1, the blade 12 is shown in three positions, one position 12-*i* may be the center position of the blade 12 which may also be considered as its initial or rest position, another position 12-*a* may be considered the position of the blade when it has performed a full deflection to one side and yet another position 12-*b* may be considered the position of the blade when it has performed a full deflection to another side as the blade oscillates.

Considering point A, selected arbitrarily, on the body of the blade, it may be seen from FIG. 1 that as the blade oscillates, point A undergoes a curved movement for example from position 12-*a* to 12-I and then to 12-*b*. This curved movement is represented in FIG. 1 by reference C. Curve C may be considered to define a plane P. Clearly, other points may be selected on the blade 12 and the movement of such points may define a respective plane which may be different from plane P defined with respect to point A. However, as those skilled in the art will realize, all such defined planes will be parallel to each other. Therefore, herein the term plane of oscillation of the blade may be understood to refer to a plane defined by the movement of a point on the blade as the blade oscillates. Clearly there may be an infinite number of such planes as the blade comprises an infinite number of points; however as all such planes are parallel to each other and each plane is a result of the oscillation of a point on the blade, each of such planes may be referred to as a plane of oscillation of the blade.

Figure 2:
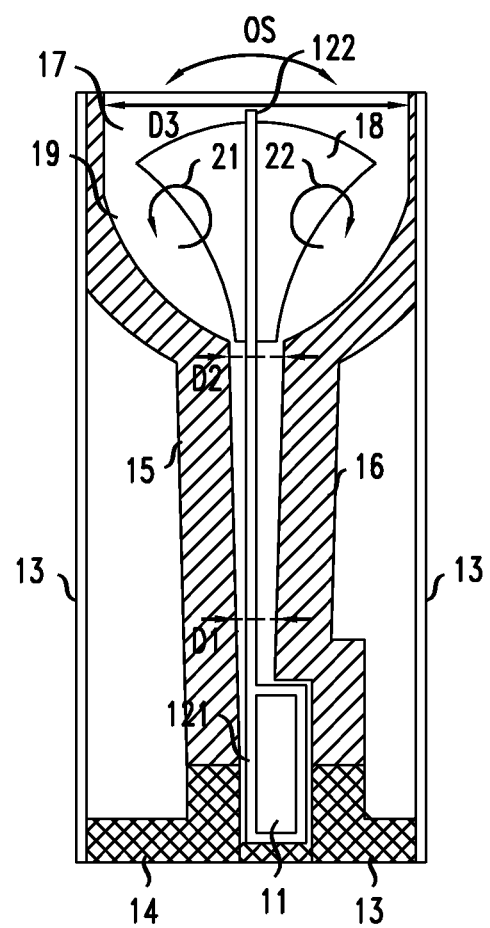
FIG. 2 is an exemplary schematic representation of a top view of a device according to an embodiment.
Figure 3:
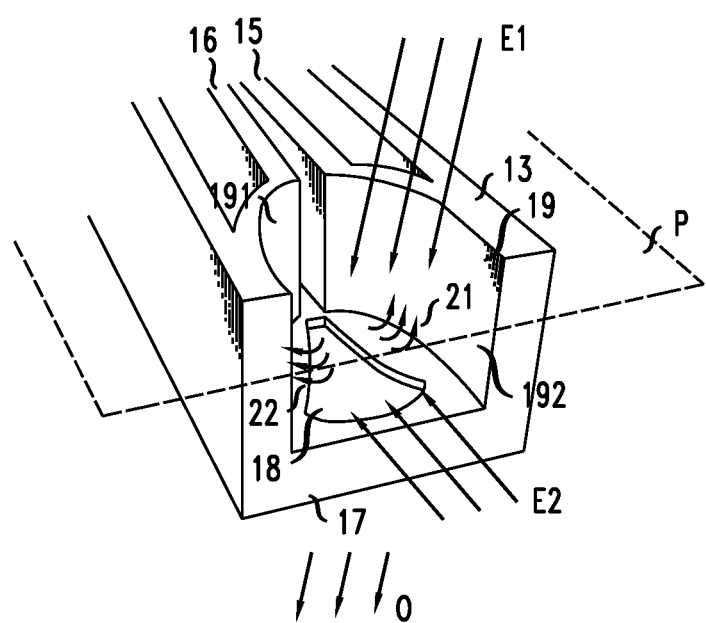
FIG. 3 is an exemplary schematic representation in partial perspective of the device of FIG. 2.

Referring now simultaneously to FIGS. 2 and 3, there are provided exemplary schematic representations of a top view and a partial perspective view, respectively, of a device for moving air according to some embodiments.

Here again, FIGS. 2 and 3 are simplified illustrations in which only the relevant parts of the device have been shown for the sake of simplicity of discussion and real-life devices may have other elements and parts not shown in the figure.

The device 1 for moving air comprises a piezoelectric element 11 which is physically attached to a first end 121 of a blade 12. The piezoelectric element and the blade are not shown in FIG. 3. A second end 122 of the blade (opposite to the first end) is free and movable. The blade may be a planar, preferably thin, body. As already mentioned above, by applying an alternating electric current to the piezoelectric element 11, the blade 12 undergoes an oscillating movement due to which the free end 122 of the blade exhibits an oscillation movement. The oscillation movement is represented in FIG. 2 by double-headed arrow OS.

The device 1 may be housed within an housing, generally represented by reference numeral 13. The housing 13 may have any convenient shape and size. The piezoelectric element 11 with the blade 12 attached thereto may be mounted on a support mechanism (not shown in FIG. 3) which may have any convenient structure within the housing 13.

The device further comprises a base plate 17. The base plate 17 may be an integral part of the housing 13 or it may be a body attached to the housing 13. The base plate 17 comprises an opening 18.

The device 1 further comprises a first wall 15 and a second wall 16. As shown in FIG. 2, the blade 12 is located between the first wall 15 and the second wall 16. The body of the blade 12 may preferably be located entirely between the first wall and the second wall (however this is not mandatory and the blade 12 may surpass to some extent the boundaries defined by the sidewalls 15 and 16 as long as the device is still capable of generating the desired movement of the air).

In this manner, the blade 12 may be made to oscillate between the first and the second walls 15, 16.

The first wall 15 and the second wall 16 may located with a separation from each other, at least at certain locations along their respective bodies, by a variable distance of separation. In FIG. 2 a first distance of separation D1 between the first wall 15 and the second wall 16 is shown at a location proximate to the piezoelectric element 11; a second distance of separation D2 is shown at an intermediate location between the movable end 122 and the piezoelectric element 11 and a third distance of separation D3 is shown at a location proximate to the movable end 122.

In some embodiments, the third distance of separation at a location proximate to the movable end 122 (e.g. D3) is larger than the second distance of separation at an intermediate location between the movable end 122 and the piezoelectric element 11 (e.g. D2). Likewise the second distance of separation D2 may be larger than the first distance of separation at a location proximate to the piezoelectric element 11 (e.g. D1).

In operation, in response to an alternating current applied to the piezoelectric element 11, the piezoelectric element oscillates. The oscillation may be maximum in amplitude at the movable end 122 of the blade. As already mentioned above, the oscillation of the blade 12 in the proximity of the movable end 122 may generate an airflow.

However, contrary to the known devices in which the air flows out of the front end of the device (front end being the end closer to the movable end of the blade) in a direction parallel to the plane of oscillation; in the present case, the air is caused to flow out of the opening 18 of the device thereby exiting the device 1 in a direction which has a certain angle with respect to the plane of oscillation (diverted-flow).

The above diverted direction of the flow of air with respect to a plane of oscillation of the blade 12 may be obtained due to the specific structure of the device. Indeed, the first wall 15 and the second wall 16 and the base plate 17 form a partially closed cavity 19. Furthermore, the cavity 19 has open areas from which air may be drawn from outside the device into the cavity 19. These open areas are therefore the areas of the cavity 19 which are not enclosed by the first wall 15, the second wall 16 and the base plate 17 (also excluding the opening 18). In the example of FIG. 3, a first open area 191 is shown as an area above the region where the blade (FIG. 2) is made to oscillate, and a second open area 192 is shown as an area in front of the device 1 (front being the end of the device 1 proximate to the movable end of the blade 12).

In operation, the oscillation of the blade 12 generates vortices 21, 22 on each half oscillation of the movable end 122 of the blade 12. These vortices 21, 22 move at a high velocity and comprise packets of air that rotate at a high velocity. The structure of the cavity 19 surrounding the blade 12 contributes in directing and focusing the vortices 21, 22 into the opening 18 thereby funneling the vortices into a jet of high velocity air.

As known by those skilled in the related art, the generation of the vortices causes a reduction in pressure which as the vortices move away, causes more air to be drawn into the region where the vortex was. According to the present disclosure, air is drawn into the cavity through openings 191 or 192 or both.

In the example of FIG. 3, a first direction of entry of the air from outside of the device in the cavity is shown by arrows E1 said entry being through the first open area 191; likewise a second direction of entry of the air from outside of the device in the cavity is shown by arrows E2 said entry being through the second open area 192. Furthermore, the direction of the exit of the air from the cavity 19 (and thus the device 1) is shown by arrows O. Assuming in the example shown in FIG. 3 that P is a plane of oscillation of the blade 12, it may be clearly observed that the direction of the flow of the air out of the device 1, arrows O, is not parallel to the plane P, rather it defines an angle with respect to said plane P. In the example of FIG. 3 the plane P is shown to be in a horizontal position whereas the arrows O are pointing downward in a vertical direction. This however is only exemplary and other directions of exit of air being non-parallel to plane P may also be envisaged.

It is to be noted that the shape of the first wall 15 and the second wall 16 may also contribute to the actions of drawing air into the cavity 19 and forcing the air inside the cavity to flow out of said cavity 19. For example, with reference to FIG. 2, when the third distance of separation D3 is larger than the second distance of separation D2, such difference in the distance of separation contributes to "trapping" the incoming air in the close vicinity of the oscillation of the movable end 122 and therefore producing an increased pressure difference between the inlet open areas (191 & 192) and outlet opening 18. Furthermore, a narrower separation at an intermediate location, i.e. between the movable end and the piezoelectric element, e.g. the distance of separation D2, may also contribute to the effect that the incoming air is not made to flow toward the rear side of the device (the side where the piezoelectric element 11 is located).

Preferably the opening 18 in the base plate 17 has an area which is smaller than either one of the first open area 191 and the second open area 192 of the cavity 19. This may be useful to ensure a flow of the outside air into the cavity from the first open area and the second open area and it is likely that it may substantially avoid unwanted entry of outside air through the opening 18 into the cavity 19. The smaller outlet area of the opening 18 may also provide an acceleration of the air flow through the cavity 19 which has entered from open areas 191 and 192, thereby resulting in a high velocity jet at the opening 18. Furthermore, a narrower opening may contribute to the pressure rise capability of the air moving device, which may be beneficial for forcing air through high resistance finned/heat sink structures.

The device for moving air as proposed herein may be incorporated into a cooling system comprising heat sinks. In addition, such cooling systems may already have passive or active heat removal mechanisms installed therein and additionally incorporate the device for moving air as proposed herein.

The solution proposed herein has important advantages over the known solutions as it allows for significant increase in the rate of heat transfer from adjacent heat loads, or heated surfaces, while at the same time it may require less heat transfer surface area, thereby reducing heat sink volume and weight requirements to remove a given heat load. Furthermore it enables higher reliability as compared to conventional fans. This is because although the device as proposed herein has moving parts, there is no or negligible sliding contact and therefore negligible or very little wear due to friction. In addition, the proposed device requires no lubrication. Conventional motors (e.g. fans) require lubrication and when the lubrication dries up the motors tend to fail. This problem is therefore avoided with the proposed device. There is also very little heat build up within the device, elevated temperature tends to accelerate failure mechanisms which in the case of the proposed device would be avoided or minimized. The proposed mechanism is also less susceptible to dust accumulation as compared to conventional mechanisms. Furthermore, piezofans are more cost effective to manufacture and consume significantly less power (~25 mW).

Another important advantage of the proposed device is that it can be added to existing features of a product already available on the market or even installed for operation. Indeed a device as disclosed herein may be easily retrofitted to existing components of a conventional passive heat sink. For example in a vertically installed passive heat sink a plurality of air mover devices as disclosed herein may be mounted such that the jets of air emanating from each device are directed to impinge at an angle on the heat sink outer surface to prevent buoyancy opposing flow and therefore result in increased heat transfer to the ambient. Such an improvement in performance may be readily obtained without an increase in the volume of the product.

Another advantage of the device for moving air as proposed herein is that it enables the mounting of products in horizontal orientations, e.g. to interior ceilings. Horizontal mounting, in known solutions, may pose a significant thermal problem. The existing natural convection heat sinks are typically not capable of performing satisfactorily when mounted substantially horizontally (natural convection heat sinks typically need to be mounted vertically for them to work satisfactorily). Retrofitting the device proposed herein to the existing product with little modification would therefore result in increased air flow through the horizontal heat sink and alleviate thermal problems. In this context, a vertical direction is to be understood to refer to a direction parallel to the gravity vector and horizontal direction being perpendicular to the vertical direction.

Those skilled in the art to which this application relates will appreciate that other and further additions, deletions, substitutions and modifications may be made to the described embodiments.

It is to be noted that the list of structures as recited in the claims is not exhaustive and that one skilled in the art understands that equivalent structures can be substituted for the recited structure without departing from the scope of the disclosure.

Furthermore, the various embodiments of the present disclosure may be combined as long as such combination is compatible and/or complimentary.

What is claimed is:

1. A device for moving air comprising:
a piezoelectric element attached to a planar body disposed at least in part between a first wall and a second wall, the planar body being configured to oscillate at a movable end between said walls generating an airflow in response to applying alternating electric current to said piezoelectric element, wherein a movement of a point on the moveable end of the planar body, as the planar body oscillates, defines a plane of oscillation;
the device further comprising a base plate such that the first wall, the second wall and the base plate form a partially closed cavity surrounding the movable end of the planar body, said base plate further comprising an opening located proximate to said movable end of the planar body and configured for allowing an airflow from said partially closed cavity to exit out of the device at a direction that is non-parallel to the plane of oscillation.

2. The device of claim 1, wherein said first wall and said second wall are separated from each other by a variable distance of separation such that a distance of separation between the first wall and the second wall at a location proximate to the movable end is larger than a distance of separation between the first wall and the second wall at an intermediate location between the movable end and the piezoelectric element.

3. The device of claim 1, wherein the cavity has a first open area for inlet of air from outside of the device into the cavity in a first direction and a second open area for inlet of air from outside of the device into the cavity in a second direction different from the first direction.

4. The device of claim 3, wherein the opening in the base plate has an area which is smaller than either one of the first open area and the second open area of the cavity.

5. A cooling system comprising:
a device for moving air, said device comprising:
a piezoelectric element attached to a planar body disposed at least in part between a first wall and a second wall, the planar body being configured to oscillate at a movable end between said walls generating an airflow in response to applying alternating electric current to said piezoelectric element, wherein a movement of a point on the moveable end of the planar body, as the planar body oscillates, defines a plane of oscillation;
the device further comprising a base plate such that the first wall, the second wall and the base plate form a partially closed cavity surrounding the movable end of the planar body, said base plate further comprising an opening located proximate to said movable end of the planar body and configured for allowing an airflow from said partially closed cavity to exit out of the device at a direction that is non-parallel to the plane of oscillation.

6. The cooling system of claim 5, wherein said first wall and said second wall are separated from each other by a variable distance of separation such that a distance of separation between the first wall and the second wall at a location proximate to the movable end is larger than a distance of separation between the first wall and the second wall at an intermediate location between the movable end and the piezoelectric element.

7. The cooling system of claim 5, wherein the cavity has a first open area for inlet of air from outside of the device into the cavity in a first direction and a second open area for inlet of air from outside of the device into the cavity in a second direction different from the first direction.

8. The cooling system of claim 7, wherein the opening in the base plate has an area which is smaller than either one of the first open area and the second open area of the cavity.

* * * * *